（12）United States Patent
Yamashita et al.

(10) Patent No.: US 9,082,873 B2
(45) Date of Patent: Jul. 14, 2015

(54) METHOD AND STRUCTURE FOR FINFET WITH FINELY CONTROLLED DEVICE WIDTH

(71) Applicant: International Business Machines Corporation, Armonk, NY (US)

(72) Inventors: Tenko Yamashita, Schenectady, NY (US); Kangguo Cheng, Schenectady, NY (US); Balasubramanian S. Haran, Watervliet, NY (US); Shom Ponoth, Clifton Park, NY (US); Theodorus Eduardus Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 267 days.

(21) Appl. No.: 13/623,276

(22) Filed: Sep. 20, 2012

(65) Prior Publication Data

US 2014/0077296 A1    Mar. 20, 2014

(51) Int. Cl.
*H01L 21/331*    (2006.01)
*H01L 21/8234*    (2006.01)
*H01L 21/84*    (2006.01)
*H01L 27/088*    (2006.01)
*H01L 27/12*    (2006.01)

(52) U.S. Cl.
CPC ...... *H01L 21/823431* (2013.01); *H01L 21/845* (2013.01); *H01L 27/0886* (2013.01); *H01L 27/1211* (2013.01)

(58) Field of Classification Search
CPC .............. H01L 21/823431; H01L 21/845; H01L 27/0886; H01L 27/1211; H01L 27/1203; H01L 29/66795; H01L 29/785; H01L 29/7851
USPC ................. 257/347, E27.112; 438/197, 311
See application file for complete search history.

(56) References Cited

U.S. PATENT DOCUMENTS

| | | | |
|---|---|---|---|
| 6,909,147 B2 | 6/2005 | Aller et al. | |
| 7,709,303 B2 | 5/2010 | Burnett et al. | |
| 7,781,273 B2 | 8/2010 | Schepis et al. | |
| 7,888,192 B2 | 2/2011 | Marshall et al. | |
| 8,116,121 B2 | 2/2012 | Kawasaki | |
| 8,174,058 B2 | 5/2012 | Marshall et al. | |
| 2004/0222477 A1* | 11/2004 | Aller et al. | 257/412 |
| 2005/0051825 A1* | 3/2005 | Fujiwara et al. | 257/308 |
| 2007/0161171 A1* | 7/2007 | Burnett et al. | 438/197 |
| 2012/0313169 A1* | 12/2012 | Wahl et al. | 257/347 |

* cited by examiner

*Primary Examiner* — Khiem D Nguyen
(74) *Attorney, Agent, or Firm* — Joseph P. Abate; Howard M. Cohn

(57) ABSTRACT

A structure and method for fabricating finFETs of varying effective device widths is disclosed. Groups of fins are shortened by a predetermined amount to achieve an effective device width that is equivalent to a real (non-integer) number of full-sized fins. The bottom of each group of fins is coplanar, while the tops of the fins from the different groups of fins may be at different levels.

8 Claims, 13 Drawing Sheets

METHOD AND STRUCTURE FOR FINFET WITH FINELY CONTROLLED DEVICE WIDTH

FIELD OF THE INVENTION

The present invention relates generally to semiconductor fabrication, and more particularly, to a finFET, and method of fabrication.

BACKGROUND OF THE INVENTION

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry.

FinFET technology is becoming more prevalent as device size continues to shrink. It is therefore desirable to have an improved structure and fabrication process for forming FinFET structures.

SUMMARY OF THE INVENTION

In one embodiment, a method for forming a semiconductor structure is provided. The method comprises covering a first group of fins disposed on a semiconductor substrate with a mask layer, removing an upper portion of a second group of fins disposed on the semiconductor substrate, such that the first group of fins is coplanar with the second group of fins on the semiconductor substrate, removing the mask layer, forming a first finFET, wherein a gate of the first finFET comprises the first group of fins; and forming a second finFET, wherein a gate of the second finFET comprises the second group of fins.

In another embodiment, a method for forming a semiconductor structure is provided. The method comprises covering a first group of fins and a second group of fins disposed on a semiconductor substrate with a first mask layer, removing an upper portion of a third group of fins disposed on the semiconductor substrate, such that the first group of fins, second group of fins, and third group of fins are coplanar with each other on the semiconductor substrate, removing the first mask layer, covering the first group of fins and the third group of fins with a second mask layer, removing an upper portion of the second group of fins disposed on the semiconductor substrate, such that the first group of fins, second group of fins, and third group of fins are coplanar with each other on the semiconductor substrate, removing the second mask layer, forming a first finFET, wherein a gate of the first finFET comprises the first group of fins, forming a second finFET, wherein a gate of the second finFET comprises the second group of fins; and forming a third finFET, wherein a gate of the third finFET comprises the third group of fins.

In another embodiment, a semiconductor structure is provided. The structure comprises a first group of fins disposed on a semiconductor substrate having a first height, a second group of fins disposed on the semiconductor substrate having a second height, wherein the first height is greater than the second height, and wherein the first group of fins and second group of fins are coplanar at the semiconductor substrate.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. In some cases, in particular pertaining to signals, a signal name may be oriented very close to a signal line without a lead line to refer to a particular signal, for illustrative clarity.

Figure 1:
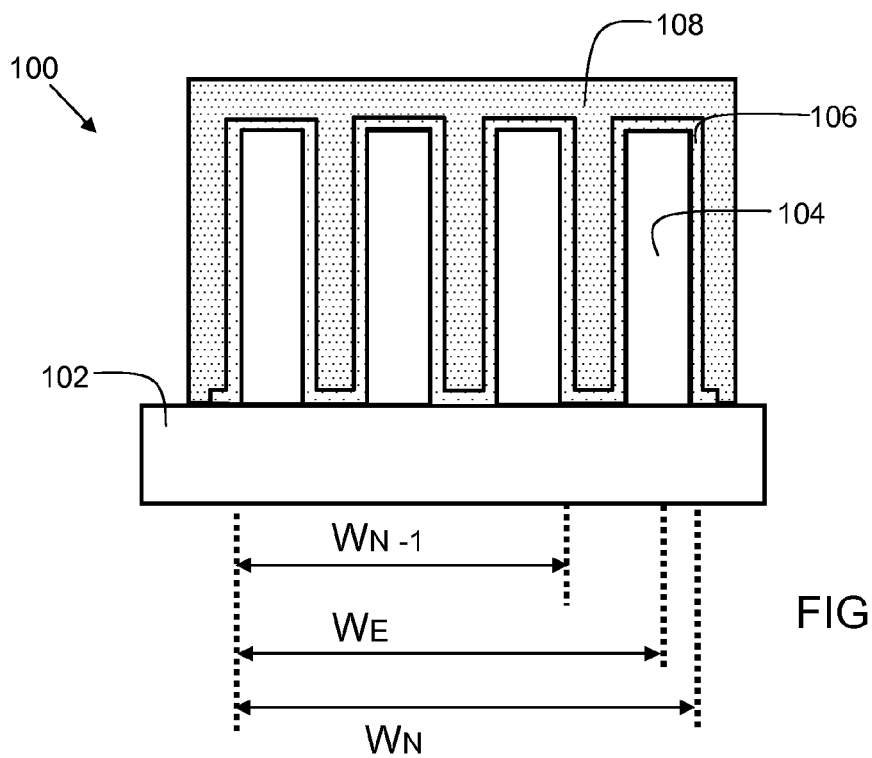

Often, similar elements may be referred to by similar numbers in various figures (FIGs) of the drawing, in which case typically the last two significant digits may be the same, the most significant digit being the number of the drawing figure (FIG). Furthermore, for illustrative clarity, some reference numbers and/or features may be omitted in certain drawings.

FIG. 1 illustrates an equivalent device width in accordance with an embodiment of the present invention.

Figure 2:
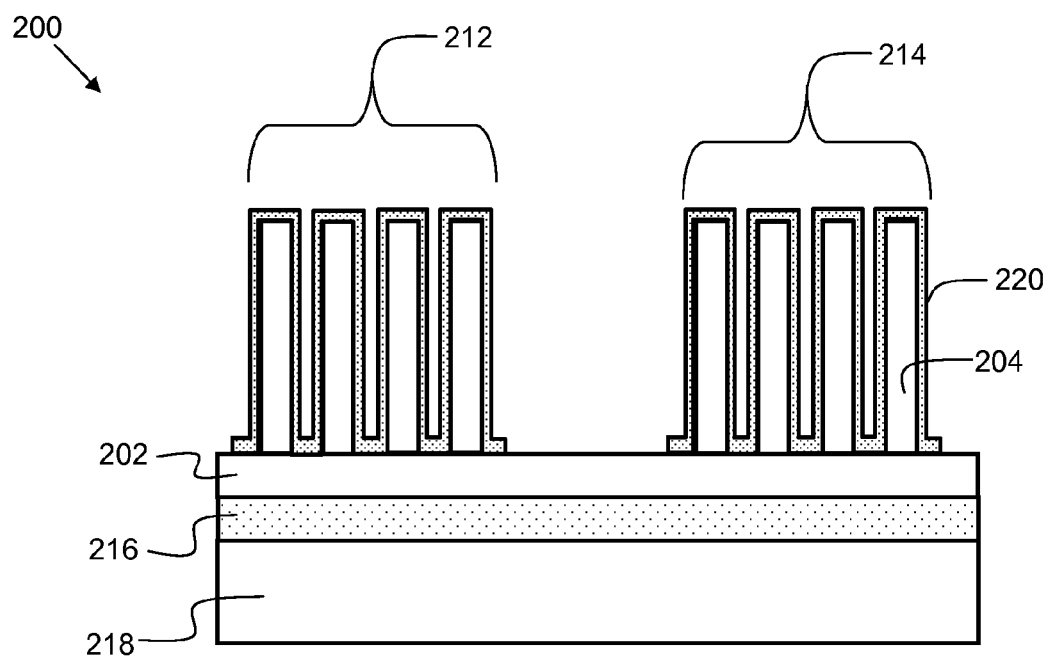

FIG. 2 shows a semiconductor structure at a starting point for an embodiment of the present invention.

Figure 3A:
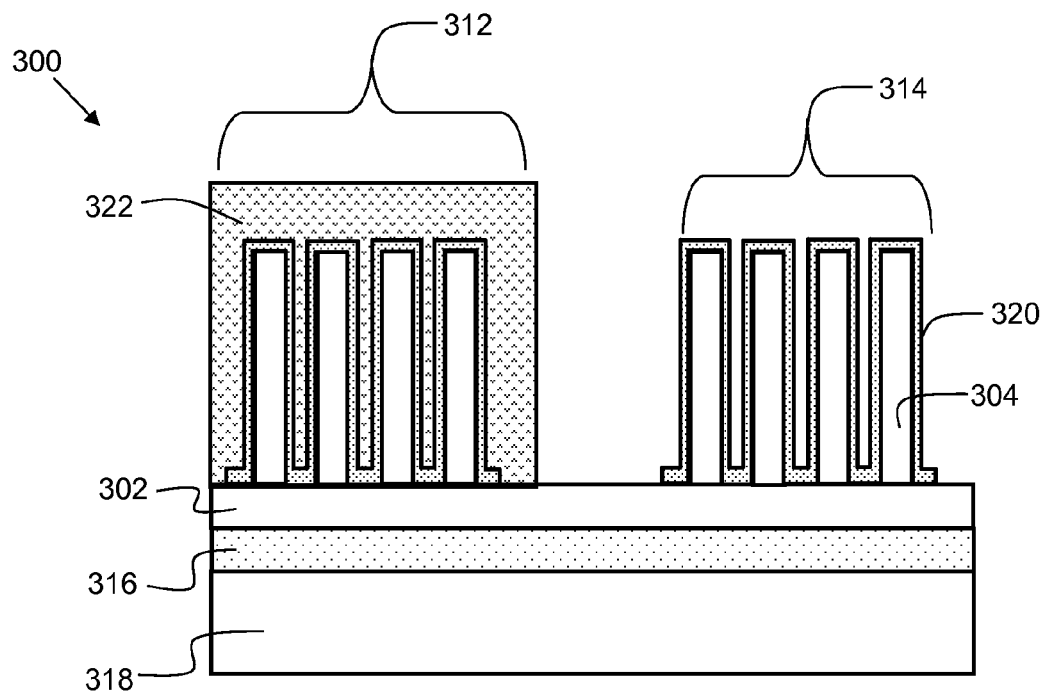

FIG. 3A shows a semiconductor structure at a subsequent process step of masking the first group of fins.

Figure 3B:
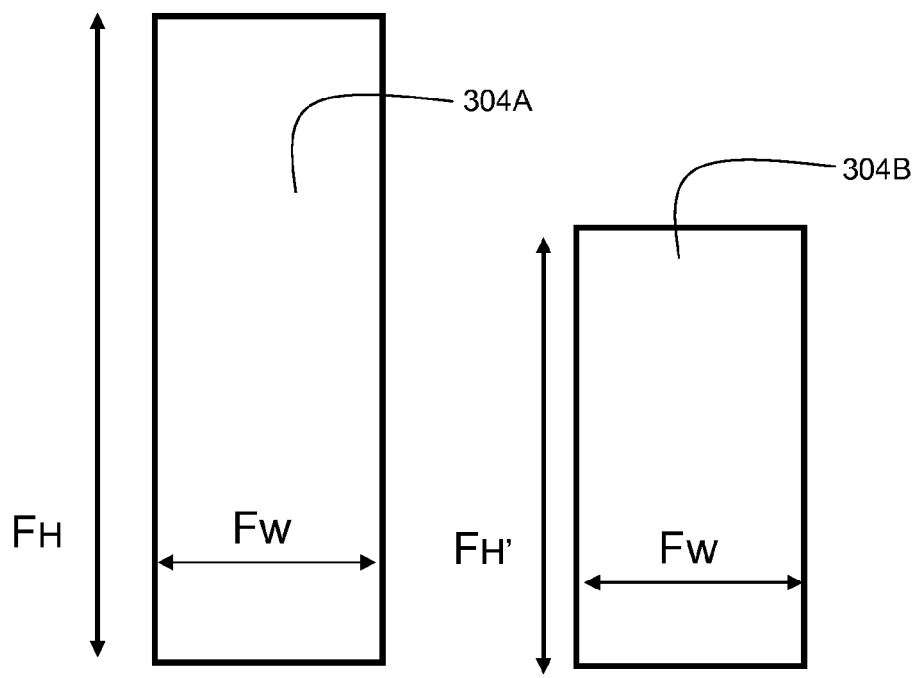

FIG. 3B shows dimensions of a full-sized fin and a shortened fin.

Figure 4:
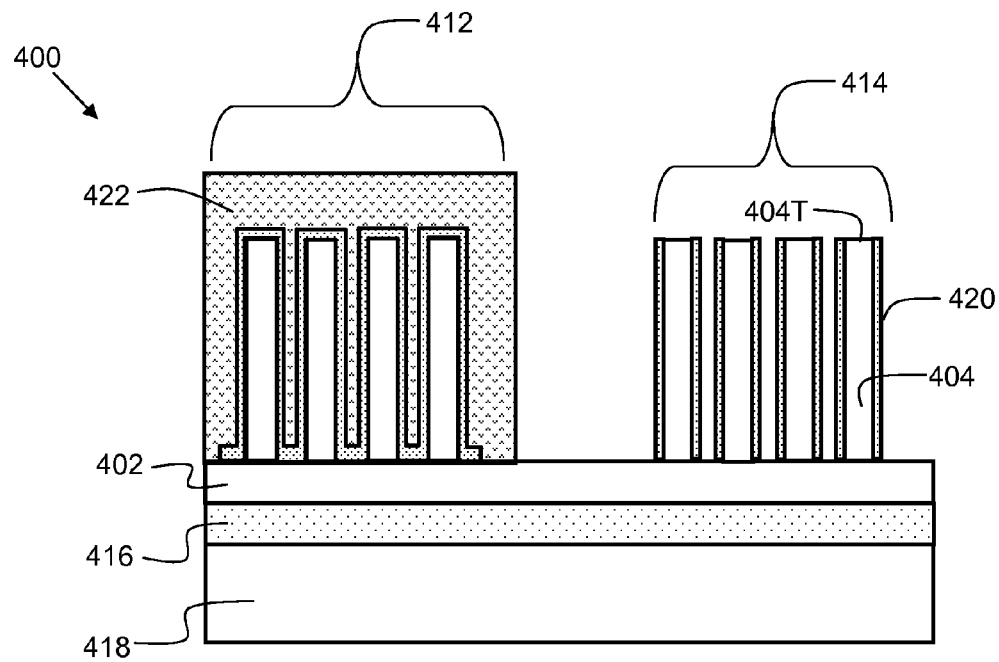

FIG. 4 shows a semiconductor structure at a subsequent process step of exposing the fin tops of the second group of fins.

Figure 5:
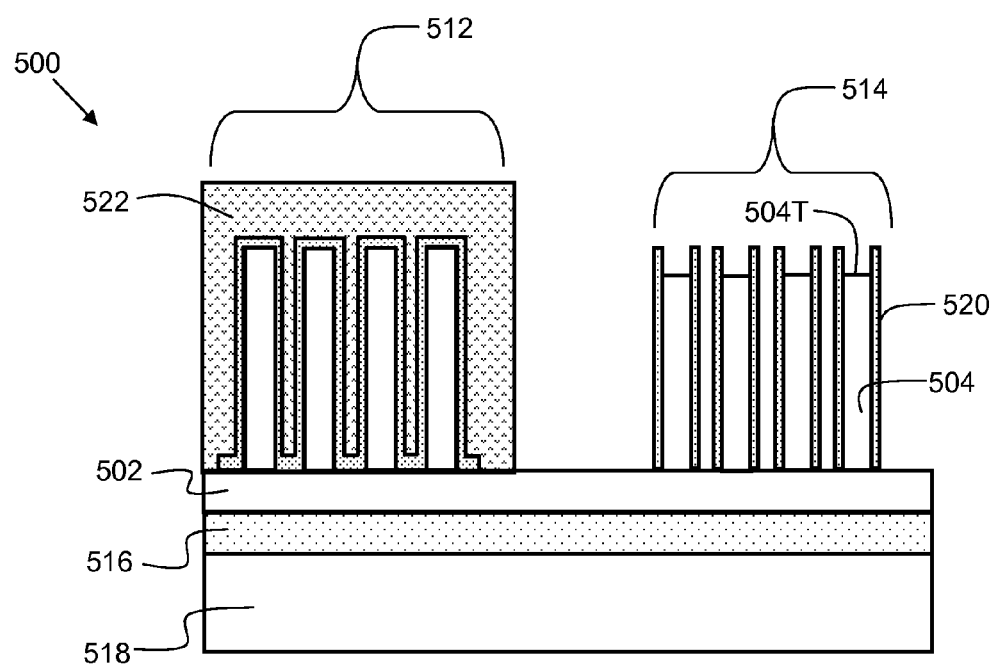

FIG. 5 shows a semiconductor structure at a subsequent process step of shortening the second group of fins.

Figure 6:
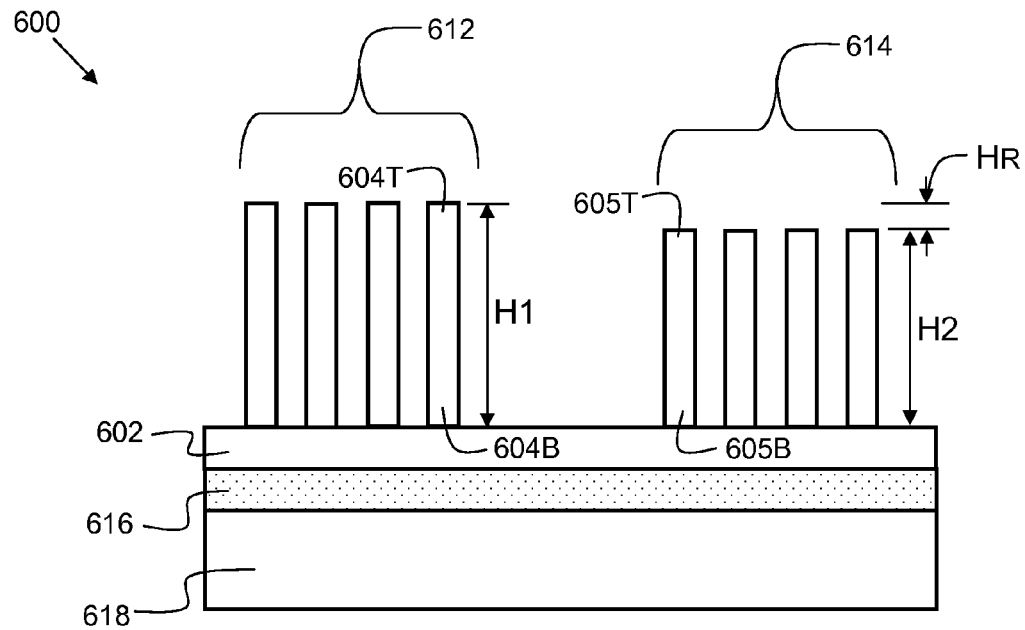

FIG. 6 shows a semiconductor structure at a subsequent process step of oxide and mask removal.

Figure 7:
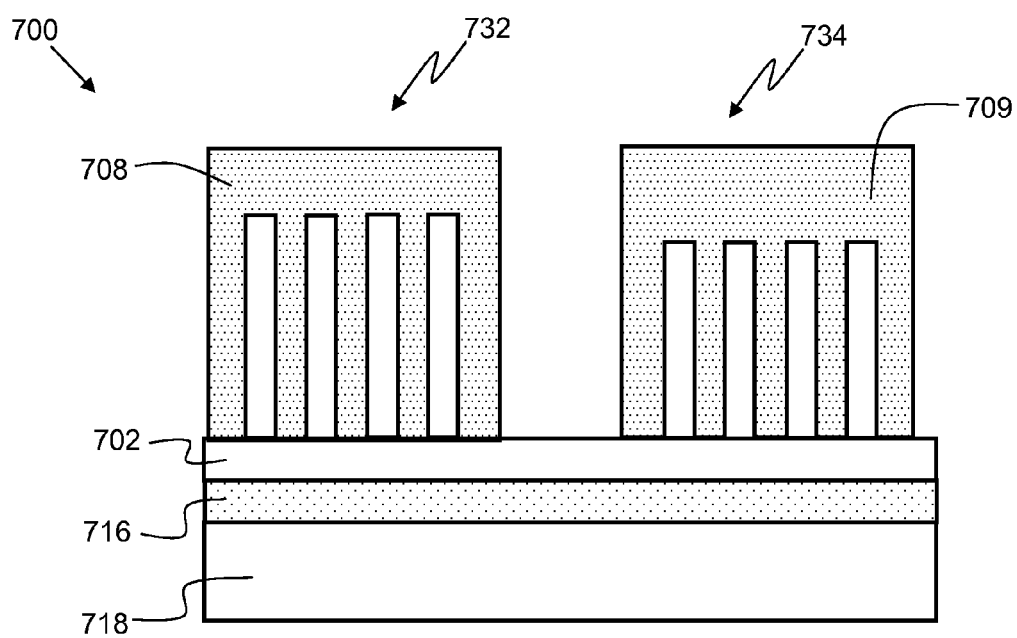

FIG. 7 shows a semiconductor structure in accordance with an embodiment of the present invention.

Figure 8:
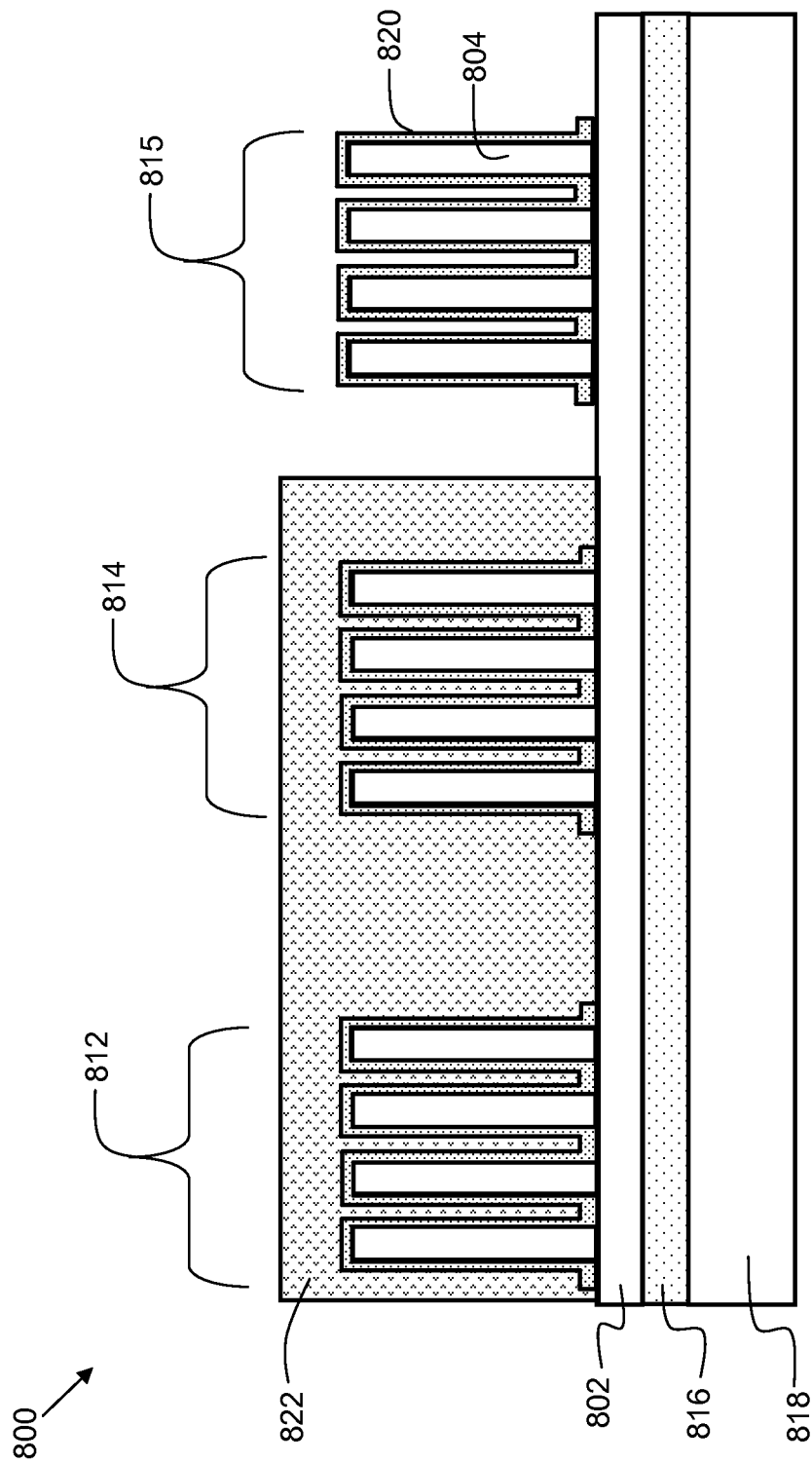

FIG. 8 shows a semiconductor structure in accordance with an alternative embodiment of the present invention, at an intermediate process step of masking two groups of fins.

Figure 9:
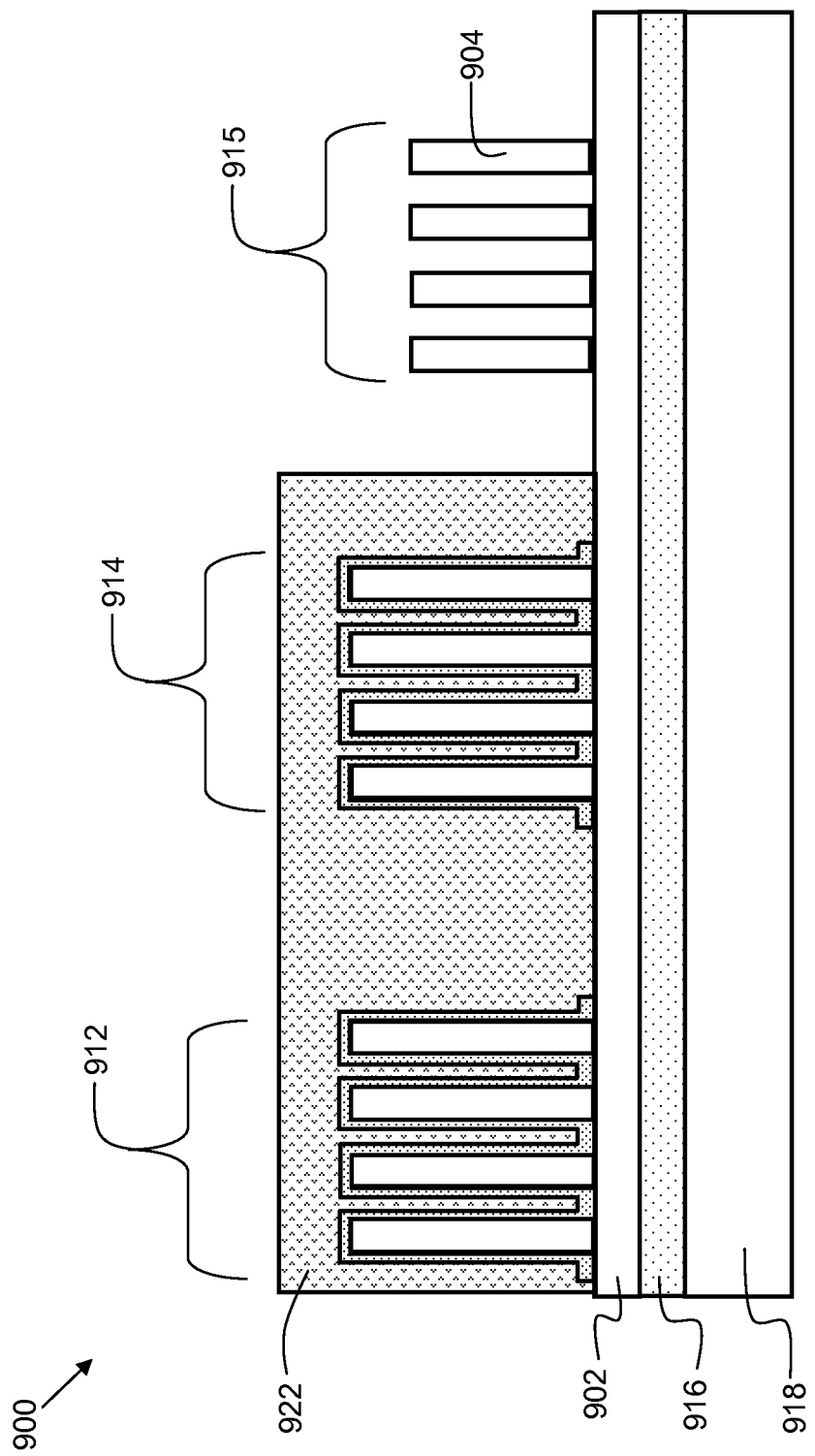

FIG. 9 shows a semiconductor structure in accordance with an alternative embodiment of the present invention, at an intermediate process step of shortening a third group of fins.

Figure 10:
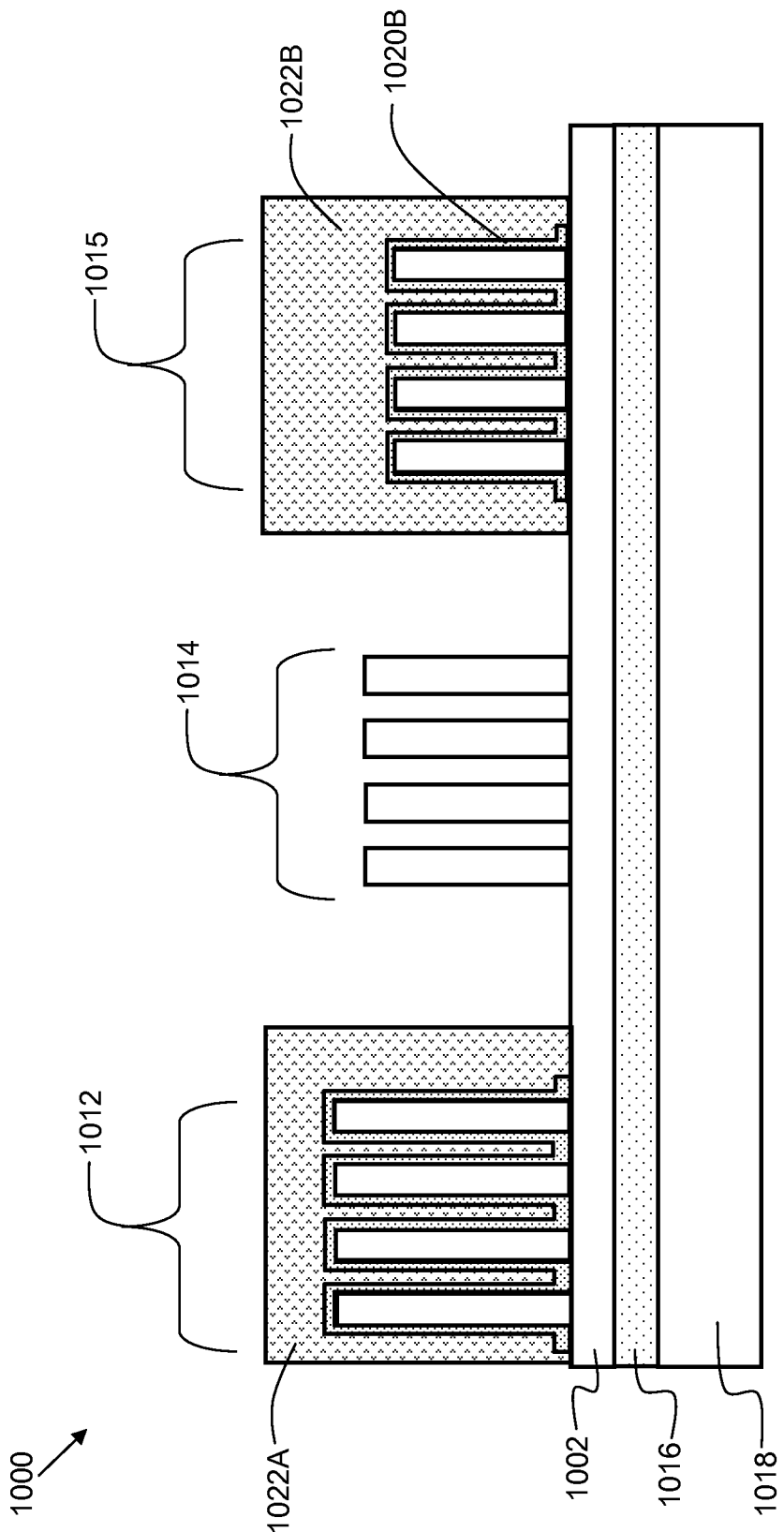

FIG. 10 shows a semiconductor structure in accordance with an alternative embodiment of the present invention, at an intermediate process step of shortening the second group of fins.

Figure 11:
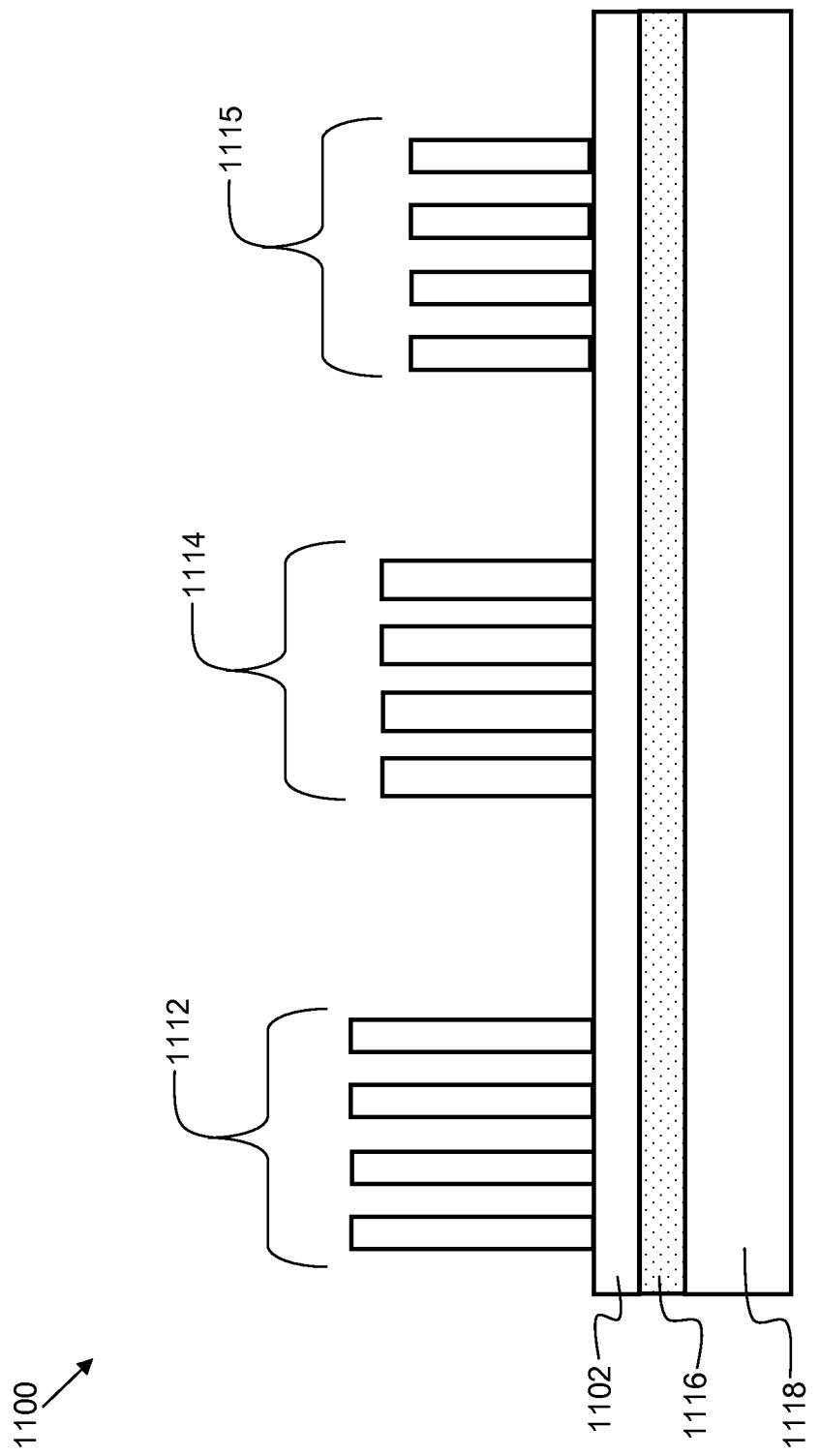

FIG. 11 shows a semiconductor structure in accordance with an alternative embodiment of the present invention, at an intermediate process step of removing masks and oxides from three groups of fins.

Figure 12:
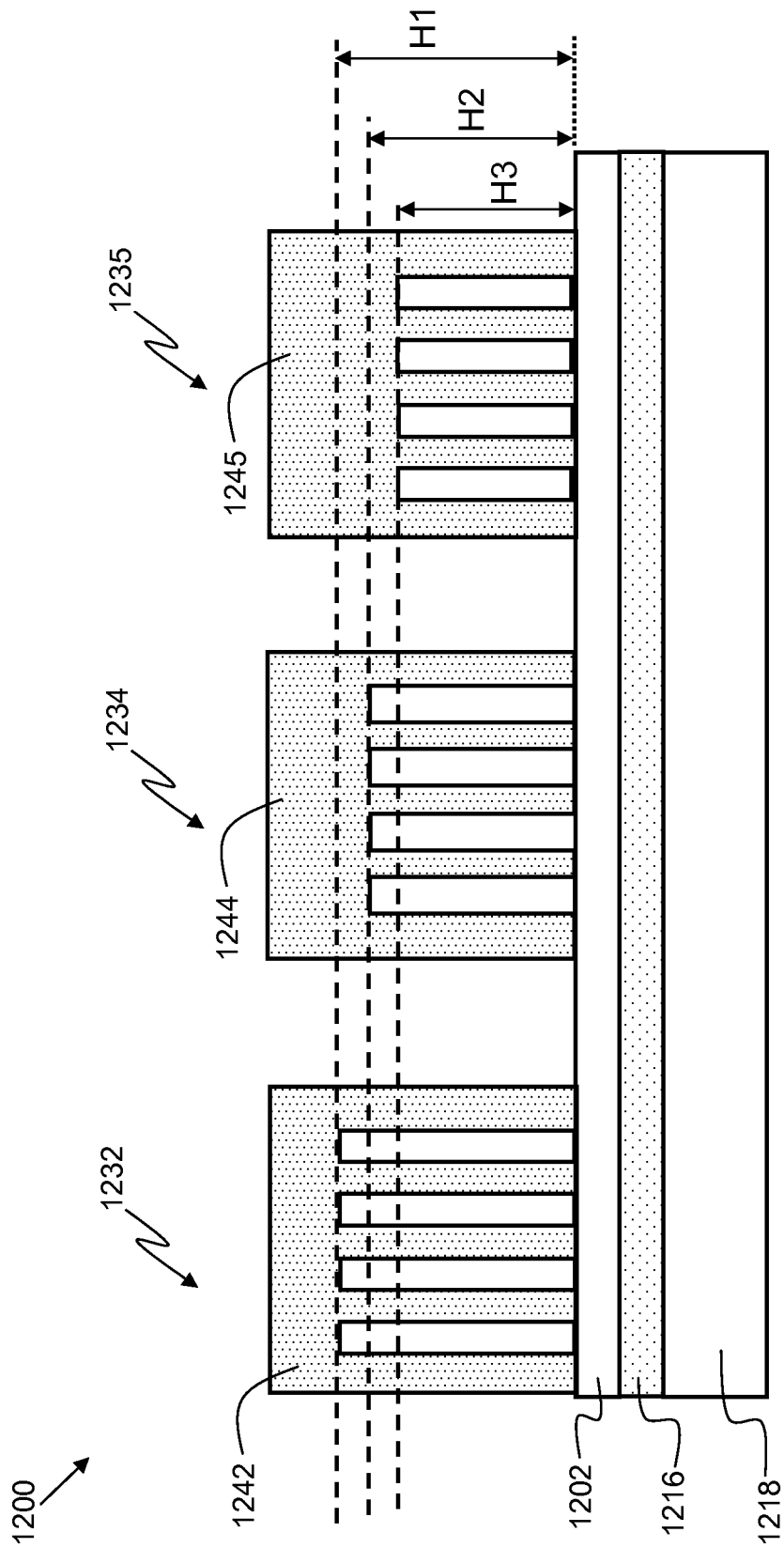

FIG. 12 shows a semiconductor structure in accordance with an alternative embodiment of the present invention, comprising three finFETs, with each finFET having fins of a different height as compared to the other finFETs.

Figure 13A:
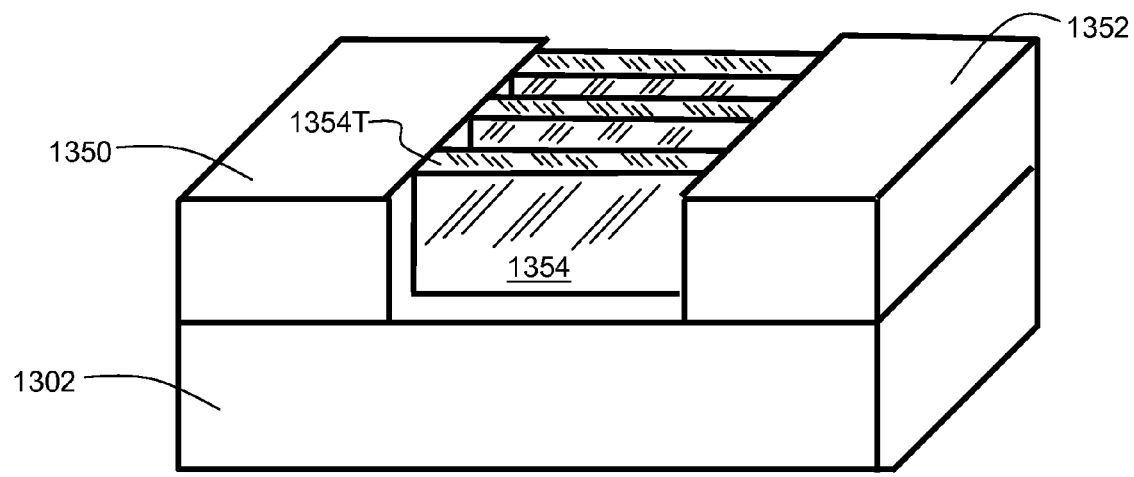
Figure 13B:
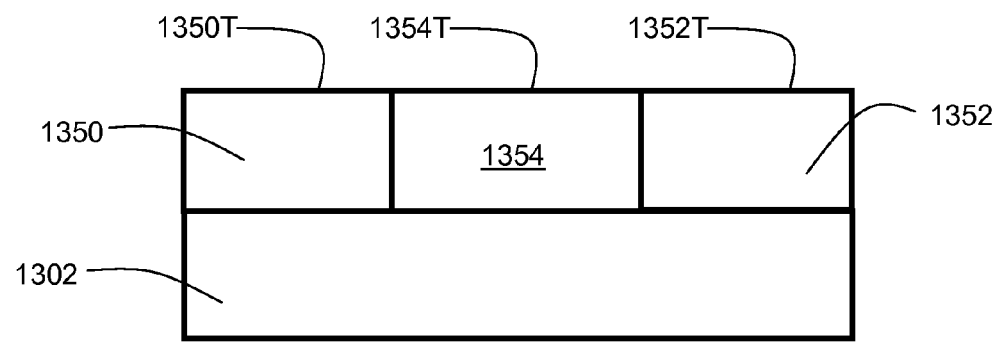

FIG. 13A and FIG. 13B show a perspective and side view of a first finFET in accordance with an embodiment of the present invention.

Figure 14A:
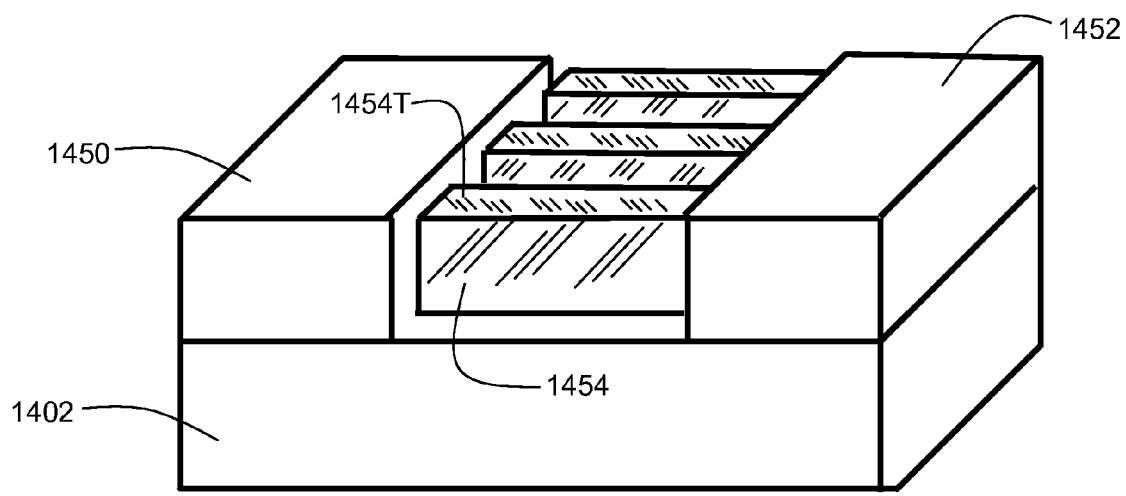
Figure 14B:
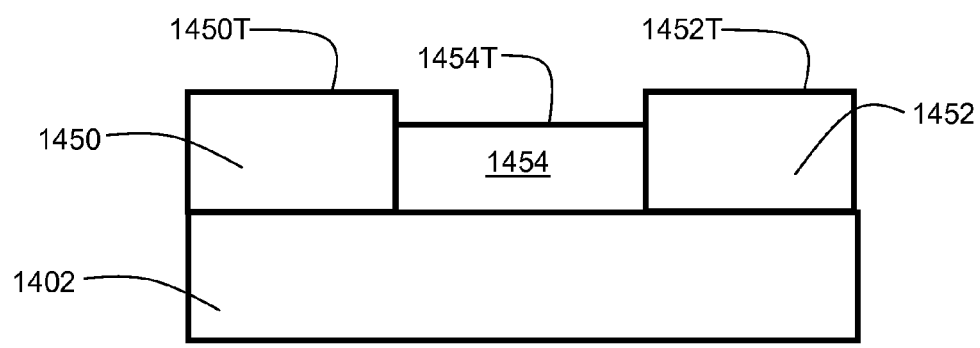

FIG. 14A and FIG. 14B show a perspective and side view of a second finFET in accordance with an embodiment of the present invention.

Figure 15:
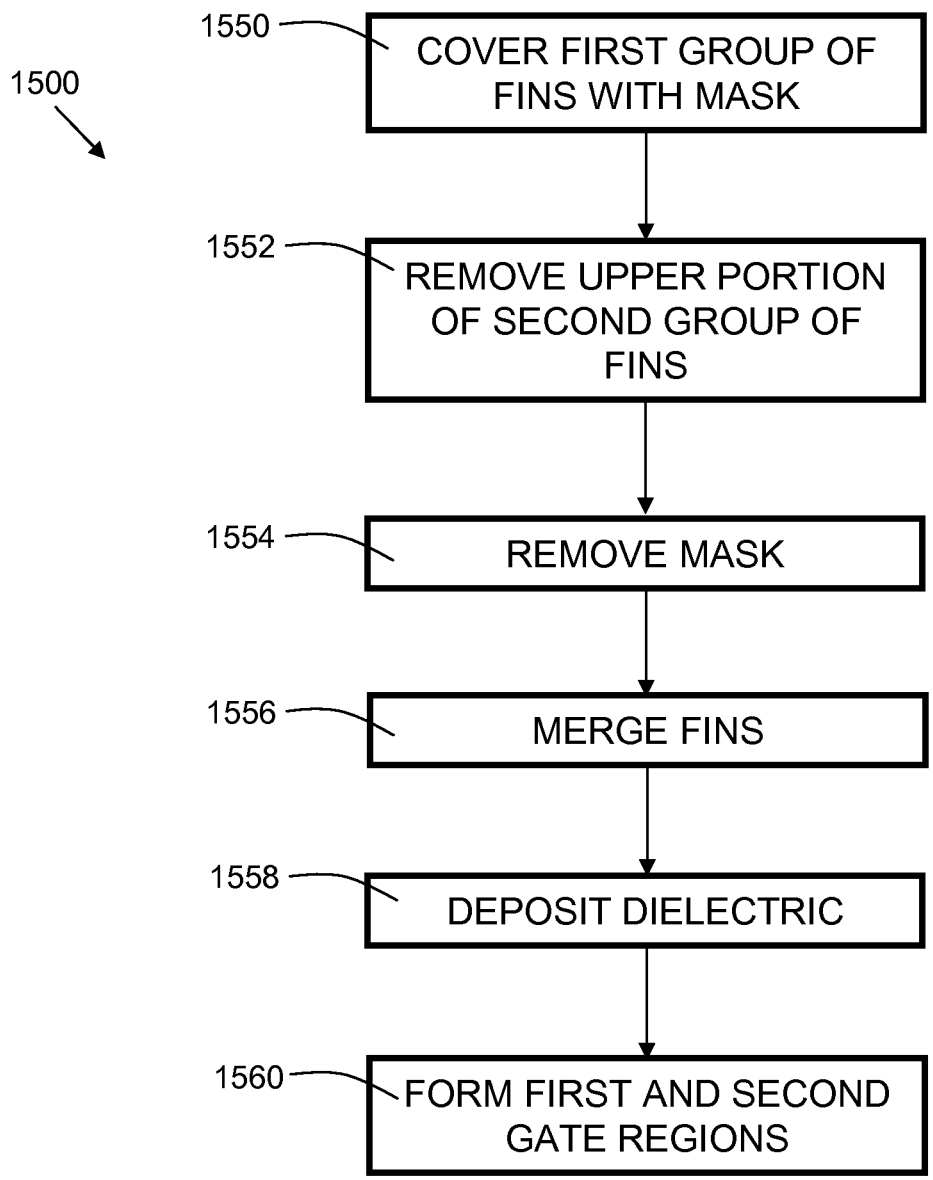

FIG. 15 is a flowchart indicating process steps for an embodiment of the present invention.

Figure 16:
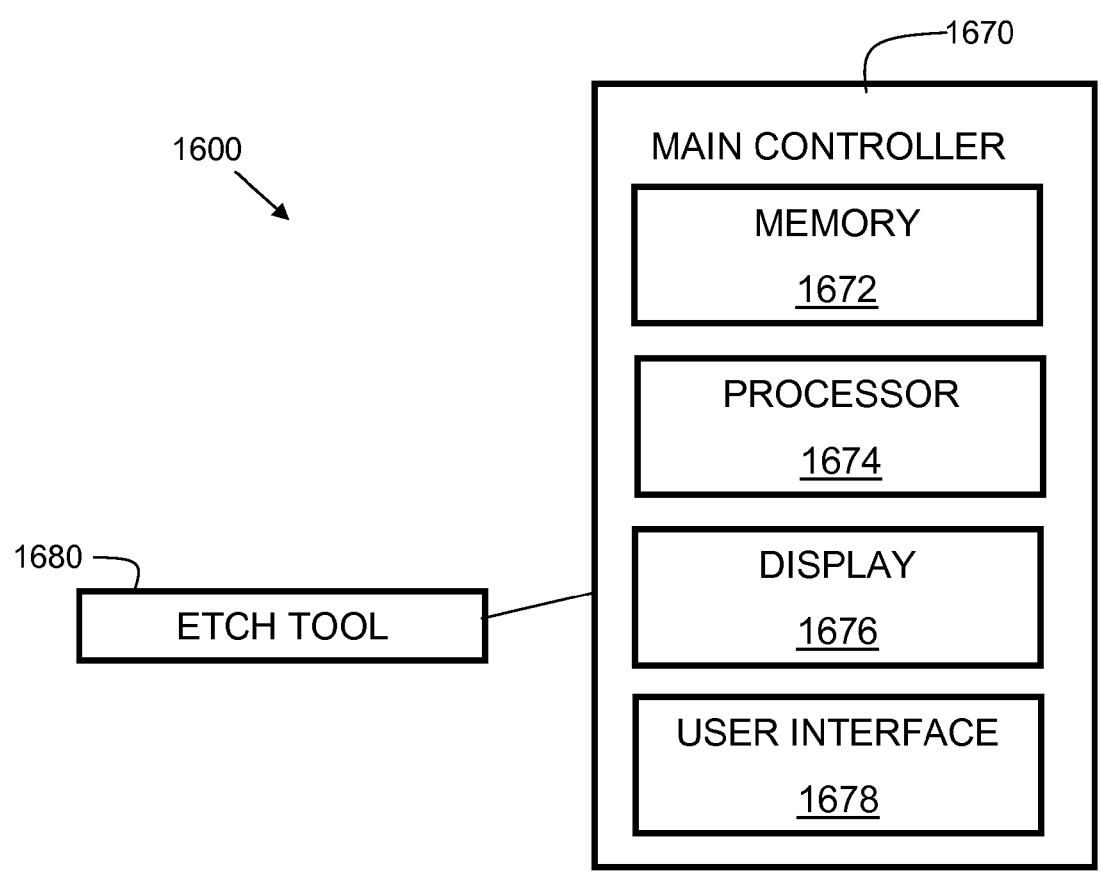

FIG. 16 is a block diagram of a system in accordance with an embodiment of the present invention.

DETAILED DESCRIPTION

FIG. 1 illustrates an equivalent device width in accordance with an embodiment of the present invention. Semiconductor structure 100 comprises a plurality of fins (indicated generally as 104), disposed on a substrate 102. Substrate 102 may be silicon, and may be a silicon-on-insulator (SOI) layer. A dielectric layer 106 is disposed over the fins. A gate electrode 108 is disposed over the dielectric layer 106, thus forming a finFET gate. The device width, which is the width of the gate, is an important design parameter when designing finFETs. The device width is a function of the number of fins used. In prior art methods, a designer may choose a device width of N fins (indicated by $W_N$ arrow). If the designer determines a narrower device width is better, he can choose a device width of N-1 fins (indicated by $W_{N-1}$ arrow). The designer is in this case, limited to the discrete widths of either N fins or N-1 fins. However, in calculating an ideal device width, the designer may determine a desired with as a real (non-integer) number of fins. For example, a designer might determine that, ideally, the effective device width should be 3.85 fins (indicated by $W_E$ arrow). However, it is not practical to have a fin that has a width of 0.85 times the width of a full-sized fin.

Embodiments of the present invention allow a designer to achieve a non-integer effective design width by shortening a subset of fins. Embodiments of the present invention provide for shortening some subsets of fins while leaving other subsets as full-length, hence providing more design flexibility. In some embodiments, multiple subsets of fins are shortened to different heights, such that there may be three or more different fin heights used on the same semiconductor structure.

FIG. 2 shows a semiconductor structure 200 at a starting point for an embodiment of the present invention. A first group of fins 212 and a second group of fins 214 is disposed on a SOI layer 202. SOI layer 202 is disposed on a buried oxide (BOX) layer 216. BOX layer 216 is disposed on a bulk semiconductor structure 218, which may also comprise silicon. Each group of fins (212, 214) is comprised of multiple individual fins (indicated generally as 204). An oxide layer 220 is disposed over each group of fins.

FIG. 3A shows a semiconductor structure at a subsequent process step of masking the first group of fins. As stated previously, often, similar elements may be referred to by similar numbers in various figures (FIGs) of the drawing, in which case typically the last two significant digits may be the same, the most significant digit being the number of the drawing figure (FIG). For example, BOX layer 316 of FIG. 3 is similar to BOX layer 216 of FIG. 2. A mask layer 322 is disposed over the first group of fins 312. The mask layer 322 may be deposited via industry-standard lithographic patterning and deposition methods. The first group of fins 312 is to be preserved at its original height. The second group of fins 314 is to be shortened to provide a non-integer effective device width. The effective device width is based on a reduced surface area of the shorter fins. Since each fin (original height or shortened) has the same width, the width dimension can be ignored, and the calculation simplifies to determining a reduced fin perimeter.

FIG. 3B shows dimensions of a full-sized fin 304A and a shortened fin 304B. Fin 304A has a fin width of Fw and a fin height of $F_H$. Fin 304B has a fin width of Fw and a fin height of $F_{H'}$. The exposed fin perimeter is defined as:

$$2(F_H)+Fw$$

The amount of shortening needed to achieve an effective fin width can be computed as follows:

The total exposed perimeter for a group of fins containing N fins is:

$$N(2(F_H)+Fw)$$

The effective width is based on an effective fin count parameter N', which is a real (non-integer) number of fins.

An effective perimeter can then be computed as:

$$N'(2(F_H)+Fw)$$

Next, the equivalent perimeter is calculated using the shortened height H' with the integer number of fins N, such that:

$$N'(2(F_H)+Fw)=N(2(F_{H'})+Fw)$$

Both N and N' are known, specified design parameters, and hence, H' (the height of the shortened fins) is then solved for.

For example, supposing there are 2 fins a in a group, then N=2. Suppose the effective design width is computed as N'=1.85, and the fin height $F_H$ is 100 nanometers and the fin width Fw is 20 nanometers. The design goal is then to determine a shortened fin height $F_{H'}$ that will yield an effective width of 1.85 fins by using two shortened fins.

$$N(2(F_H)+Fw)=2(2(100)+20)=440$$

$$N'(2(F_H)+Fw)=1.85(2(100)+20)=407=N(2(F_{H'})+Fw)$$

Therefore the reduced perimeter value is computed as $N'(2(F_H)+Fw)=407$.

Now solving for $F_{H'}$, we have:

$$2F_{H'}+20=203.5, \text{ and}$$

$$F_{H'}=91.75, \text{ therefore,}$$

A fin height reduction value defined as $F_H-F_{H'}$ results in:

$$100-91.75=8.25$$

Hence, shortening the group of fins by 8.25 nanometers results in an effective device width of 1.85 fins.

FIG. 4 shows a semiconductor structure 400 at a subsequent process step of exposing the fin tops of the second group of fins 414. The top (e.g. 404T) of each fin (e.g. 404) of the second group of fins is exposed. In one embodiment, a reactive ion etch (RIE) is used to remove the oxide 420 from the tops of the fins (compare with 320 of FIG. 3A).

FIG. 5 shows a semiconductor structure 500 at a subsequent process step of shortening the second group of fins 514. The shortening of the second group of fins 514 may be performed with a reactive ion etch to remove an amount of fin material from the second group of fins 514 that corresponds to a fin height reduction value. This results in fin tops (e.g. 504T) that are lower than the fin tops of the fins in first group of fins 512.

FIG. 6 shows a semiconductor structure 600 at a subsequent process step of oxide and mask removal. Hence, at this stage, both the mask and the oxides are removed, leaving the first group of fins 612 at an original height of H1, and the second group of fins 614 at a shortened height H2, where H2<H1. The bottom 604B of each fin of the first group of fins 612 is coplanar with the bottom 605B of each fin of the second group of fins 614. In contrast, the top 604T of each fin of the first group of fins 612 is not coplanar with the top 605T of each fin of the second group of fins 614. Second group of fins 614 has its fins reduced by a height reduction value $H_R$. In one embodiment the value for $H_R$ ranges from about 10 percent to about 30 percent of the height of the first group of fins H1. Hence, in this embodiment, the second group of fins has a height H2 that is 10 to 30 percent less than the height of the first group of fins H1. In one embodiment, the value for $H_R$ ranges from about 20 nanometers to about 60 nanometers.

FIG. 7 shows a semiconductor structure 700 in accordance with an embodiment of the present invention. A first gate electrode 708 is formed over the first group of fins, to form first finFET 732. A second gate electrode 709 is formed over the second group of fins, to form second finFET 734. The second finFET 734 has shortened fins, whereas the first finFET 732 has full-height fins. In one embodiment, first gate electrode 708 and second gate electrode 709 may be comprised of polysilicon, in accordance with a gate-first process.

In another embodiment, first gate electrode 708 and second gate electrode 709 may be comprised of metal, in accordance with a replacement metal gate (RMG) process.

The fins may be merged by industry-standard techniques, such as in-situ doped epitaxial growth. Furthermore, a dielectric layer (not shown) may be disposed in between the fins and the gate electrode that is disposed on the fins, as part of standard finFET fabrication techniques. Hence, embodiments of the present invention provide a structure and method for fine-tuning finFETs in terms of device width.

FIG. 8 shows a semiconductor structure 800 in accordance with an alternative embodiment of the present invention, at an intermediate process step of masking two groups of fins (812 and 814) with mask layer 822, while a third group of fins 815 is not covered by the mask layer 822. Each group of fins is disposed on an SOI layer 802, which is in turn disposed on BOX layer 816, which is disposed on bulk silicon layer 818.

In this embodiment, there are three groups of fins. Group of fins 812 will remain at the original fin height, group of fins 814 will be shortened to a second height, and group of fins 815 will be shortened to a third height. Each group of fins comprises multiple fins (shown generally as 804) and is covered with an oxide layer (shown generally as 820). Hence, although it results in additional process steps, this embodiment allows more flexibility in terms of selecting an effective device width for multiple finFETs on the same semiconductor structure.

FIG. 9 shows a semiconductor structure 900 in accordance with an alternative embodiment of the present invention, at an intermediate process step of shortening a third group of fins. The third group of fins 915 is shortened similar to the manner described and shown in FIG. 3A through FIG. 6.

FIG. 10 shows a semiconductor structure 1000 in accordance with an alternative embodiment of the present invention, at an intermediate process step of shortening the second group of fins 1014. Additional mask regions 1022A and 1022B may be deposited to protect group of fins 1012 and group of fins 1015 while group of fins 1014 is getting shortened. Optionally, an oxide layer 1020B may be formed over the third group of fins 1015 prior to depositing mask region 1022B, to protect the third group of fins from damage during the subsequent removal of the mask region 1022B.

FIG. 11 shows a semiconductor structure 1100 in accordance with an alternative embodiment of the present invention, at an intermediate process step of removing masks and oxides from three groups of fins. First group of fins 1112 is at the original fin height. Second group of fins 1114 is at a second height which is shorter than the original fin height. Third group of fins 1115 is at a third height, which is shorter than the second height.

FIG. 12 shows a semiconductor structure 1200 in accordance with an alternative embodiment of the present invention, comprising three finFETs (1232, 1234, and 1235), with each finFET having fins of a different height as compared to the other finFETs. Each finFET comprises a corresponding gate electrode (1242, 1244, and 1245). Note that the fins in each group of fins may be merged (e.g. via an in-situ doped epitaxial process). For the purposes of illustrative clarity, the dielectric layer between the fins and the gate electrodes is not shown, but may be disposed between the fins and the gate electrode, similar to 106 shown in FIG. 1. FinFET 1232 has a first fin height H1 which is the original (full-height) fin height. FinFET 1234 has a second fin height H2, and finFET 1235 has a third fin height H3, such that H1>H2>H3.

FIG. 13A and FIG. 13B show a perspective and side view of a first finFET (similar to finFET 1232 of FIG. 12) in accordance with an embodiment of the present invention. FIG. 13A is a perspective view, showing source region 1350 and drain region 1352 disposed on the SOI layer 1302. A plurality of fins (shown generally as 1354) is shown disposed in between the source region 1350 and drain region 1352. The top 1354T of each fin is planar with the source region 1350 and drain region 1352. FIG. 13B is a side view indicating that the top of fin 1354 is planar with the top 1350T of the source region 1350 and top 1352T of the drain region 1352.

FIG. 14A and FIG. 14B show a perspective and side view of a second finFET (similar to finFET 1234 of FIG. 12) in accordance with an embodiment of the present invention. FIG. 14A is a perspective view, showing source region 1450 and drain region 1452 disposed on the SOI layer 1402. A plurality of fins (shown generally as 1454) is shown disposed in between the source region 1450 and drain region 1452. The top 1454T of each fin is below the level of the top of the source region 1450 and drain region 1452. FIG. 14B is a side view indicating that the top 1454T of fin 1454 is below the level of the top 1450T of the source region 1450 and top 1452T of the drain region 1452.

FIG. 15 is a flowchart 1500 indicating process steps for an embodiment of the present invention. In process step 1550, a first group of fins is covered with a mask region (see 322 of FIG. 3). In process step 1552, the upper portion of a second group of fins is removed (see 514 of FIG. 5). In process step 1554, the mask layer is removed (see 600 of FIG. 6). In process step 1556, the first group of fins and second group of fins are each merged. The merging may comprise in-situ doped epitaxial growth between each fin within a group of fins. In process step 1558, a dielectric is deposited over each group of fins (see 106 of FIG. 1). In process step 1560, first and second gate electrode regions are formed (see 708 and 709 of FIG. 7).

FIG. 16 is a block diagram of a system 1600 in accordance with an embodiment of the present invention. System 1600 comprises a main controller 1670. Main controller 1670 may be a computer comprising memory 1672, and a processor 1674 which is configured to read and write memory 1672. The memory 1672 may be non-transitory memory, such as flash, ROM, non-volatile static ram, or the like. The memory 1672 contains instructions that, when executed by processor 1674, control the various subsystems to operate system 1600. Main controller 1670 may also comprise a display 1676 and a user interface 1678 for interacting with the system 1600. The user interface 1678 may comprise a keyboard, touch screen, mouse, or the like.

The main controller 618 may compute parameters pertaining to embodiments of the present invention, such as fin height reduction value $H_R$. The fin height reduction value $H_R$ may be transmitted to etch tool 1680 to program it with the proper recipe parameters for etching various groups of fins to the desired shortened heights.

As can now be appreciated, embodiments of the present invention provide a structure and method for fabricating finFETs of varying effective device widths on the same semiconductor substrate. Some groups of fins are shortened by a predetermined amount to achieve an effective device width that is equivalent to a real (non-integer) number of full-sized fins. The bottom of each group of fins is coplanar, while the tops of the fins from the different groups of fins may be at different levels. Furthermore, embodiments of the present invention may be utilized with a gate-first process, or with a RMG (replacement metal gate) process. Embodiments of the present invention may utilize a computer, the computer comprising a processor. The processor may be configured and disposed to access non-transitory memory, such as read-only memory (ROM) or flash memory. The non-transitory memory may contain instructions, that when executed by the processor, perform the computation steps to compute a fin height reduction value.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method for forming a semiconductor structure comprising:
    covering a first group of fins disposed on a semiconductor substrate with a mask layer;
    removing an upper portion of a second group of fins disposed on the semiconductor substrate, such that the first group of fins is coplanar with the second group of fins on the semiconductor substrate;
    removing the mask layer;
    forming a first finFET, wherein a first replacement metal gate of the first finFET comprises the first group of fins; and
    forming a second finFET, wherein a second replacement metal gate of the second finFET comprises the second group of fins; and further comprising:
    computing a fin height reduction value; and
    wherein removing an upper portion of a second group of fins disposed on the semiconductor substrate comprises removing an amount of fin material from the second group of fins that corresponds to the fin height reduction value; and further comprising:
    establishing an effective fin count parameter as a non-integer number of fins;
    computing a reduced perimeter value based on the effective fin count parameter; and
    wherein computing the fin height reduction value comprises determining a height for the second group of fins based on the reduced perimeter value.

2. The method of claim 1, wherein removing an upper portion of a second group of fins is performed via a reactive ion etch process.

3. The method of claim 1, wherein computing a fin height reduction value comprises computing a fin height reduction value ranging from 10 to 30 percent of the height of the first group of fins.

4. The method of claim 1, wherein computing a fin height reduction value comprises computing a fin height reduction value ranging from 20 to 60 nanometers.

5. A method for forming a semiconductor structure comprising:
    covering a first group of fins and a second group of fins disposed on a semiconductor substrate with a first mask layer;
    removing an upper portion of a third group of fins disposed on the semiconductor substrate, such that the first group of fins, second group of fins, and third group of fins are coplanar with each other on the semiconductor substrate;
    removing the first mask layer;
    covering the first group of fins and the third group of fins with a second mask layer;
    removing an upper portion of the second group of fins disposed on the semiconductor substrate, such that the first group of fins, second group of fins, and third group of fins are coplanar with each other on the semiconductor substrate;
    removing the second mask layer;
    forming a first finFET, wherein a first replacement metal gate of the first finFET comprises the first group of fins;
    forming a second finFET, wherein a second replacement metal gate of the second finFET comprises the second group of fins; and
    forming a third finFET, wherein a third replacement metal gate of the third finFET comprises the third group of fins; and further comprising:
    computing a fin height reduction value; and
    wherein removing an upper portion of a second group of fins disposed on the semiconductor substrate comprises removing an amount of fin material from the second group of fins that corresponds to the fin height reduction value; and further comprising:
    establishing an effective fin count parameter as a non-integer number of fins;
    computing a reduced perimeter value based on the effective fin count parameter;
    wherein computing the fin height reduction value comprises determining a height for the second group of fins based on the reduced perimeter value.

6. The method of claim 5, wherein removing an upper portion of the second group of fins and removing an upper portion of the third group of fins is performed via a reactive ion etch process.

7. The method of claim 5, wherein computing a fin height reduction value comprises computing a fin height reduction value ranging from 10 to 30 percent of the fin height of the first group of fins.

8. The method of claim 5, wherein computing a fin height reduction value comprises computing a fin height reduction value ranging from 20 to 60 nanometers.

* * * * *